(12) United States Patent
Suzuki et al.

(10) Patent No.: US 12,713,861 B2
(45) Date of Patent: Aug. 18, 2026

(54) METHOD OF PROCESSING SiC WAFER

(71) Applicant: DISCO CORPORATION, Tokyo (JP)

(72) Inventors: Akifumi Suzuki, Tokyo (JP); Junichi Kuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 340 days.

(21) Appl. No.: 18/633,811

(22) Filed: Apr. 12, 2024

(65) Prior Publication Data

US 2024/0363414 A1 Oct. 31, 2024

(30) Foreign Application Priority Data

Apr. 26, 2023 (JP) ................................ 2023-072719

(51) Int. Cl.
*H10P 54/20* (2026.01)
*H10P 54/00* (2026.01)
*H10P 54/92* (2026.01)

(52) U.S. Cl.
CPC .............. *H10P 54/20* (2026.01); *H10P 54/00* (2026.01); *H10P 54/92* (2026.01)

(58) Field of Classification Search
CPC .......... H10P 54/00; H10P 54/20; H10P 54/92; H10P 72/0428; H10P 72/78
See application file for complete search history.

(56) References Cited

U.S. PATENT DOCUMENTS

2018/0323105 A1* 11/2018 DeMaioribus .......... H10P 54/00
2019/0348290 A1* 11/2019 Villamor ................. H10P 52/00

FOREIGN PATENT DOCUMENTS

CN 107464779 A * 12/2017 .......... H10P 72/7402
JP 2021167046 A 10/2021

* cited by examiner

*Primary Examiner* — Scott B Geyer
(74) *Attorney, Agent, or Firm* — Greer Burns & Crain Ltd.

(57) ABSTRACT

A method of processing an SiC wafer includes a laser processing step of applying a laser beam to the SiC wafer along projected dicing lines established thereon to sever a metal film on the SiC wafer along the projected dicing lines and form grooves in the SiC wafer along the projected dicing lines, a tape mounting step of mounting a tape on the metal film before or after the laser processing step, and a dividing step of gripping, vertically between gripping members, an area of the SiC wafer adjacent to one at a time of the projected dicing lines along which the SiC wafer is to be divided and pressing, with a pressing member, an area of the SiC wafer adjacent to and across the one of the projected dicing lines from the gripping members, thereby dividing the SiC wafer along the one of the projected dicing lines.

3 Claims, 16 Drawing Sheets

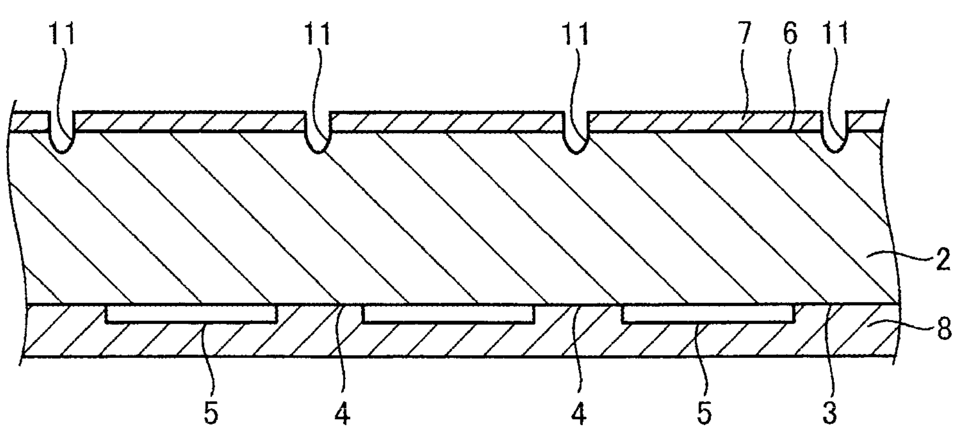
FIG.7
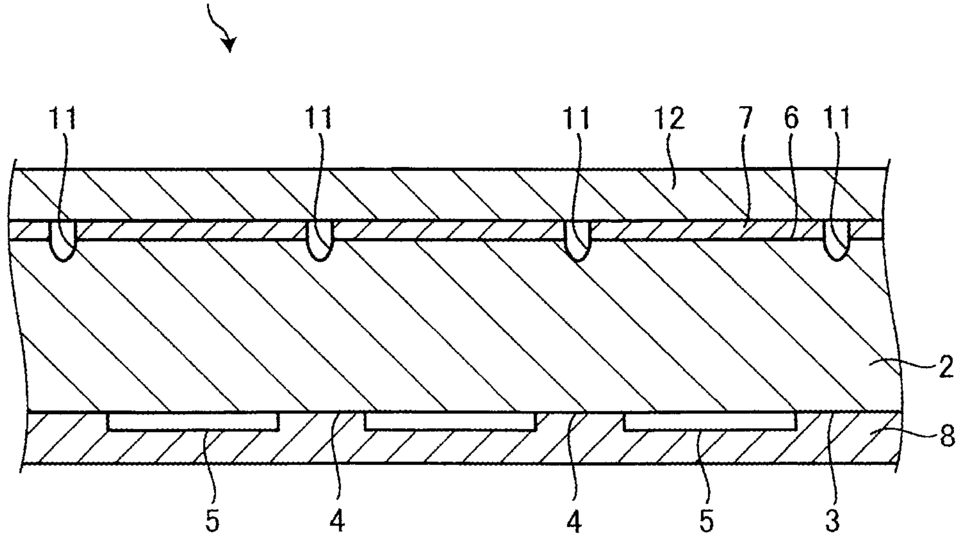

FIG.13
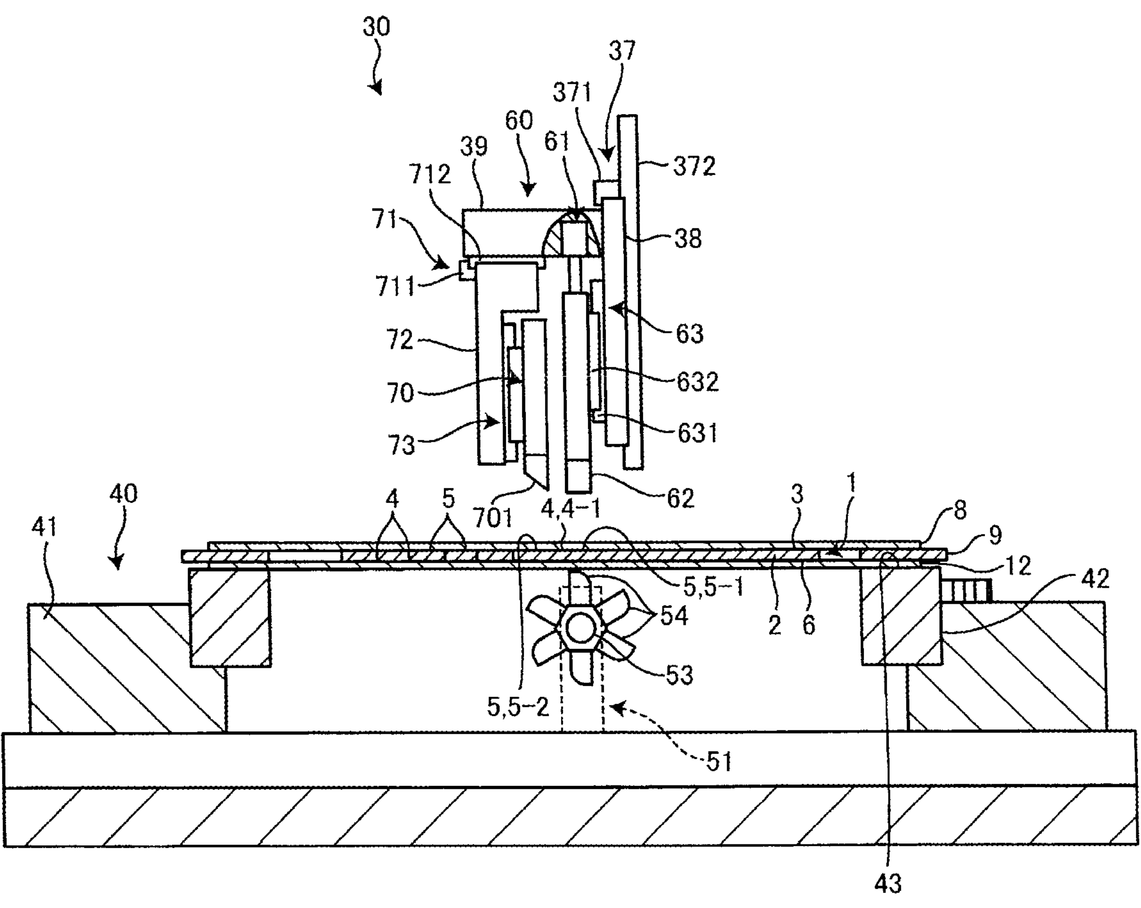
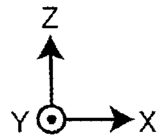

FIG. 14
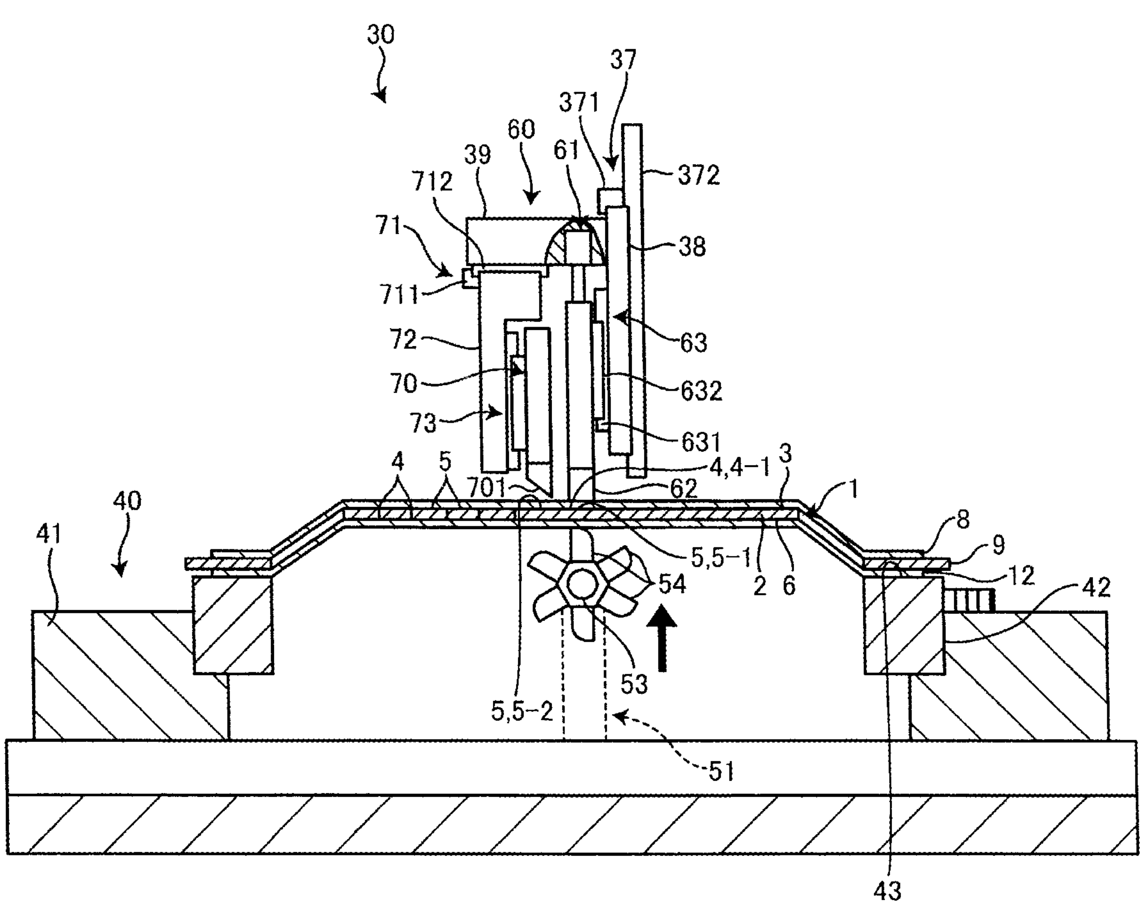
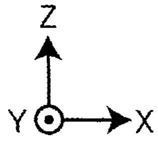

FIG. 15
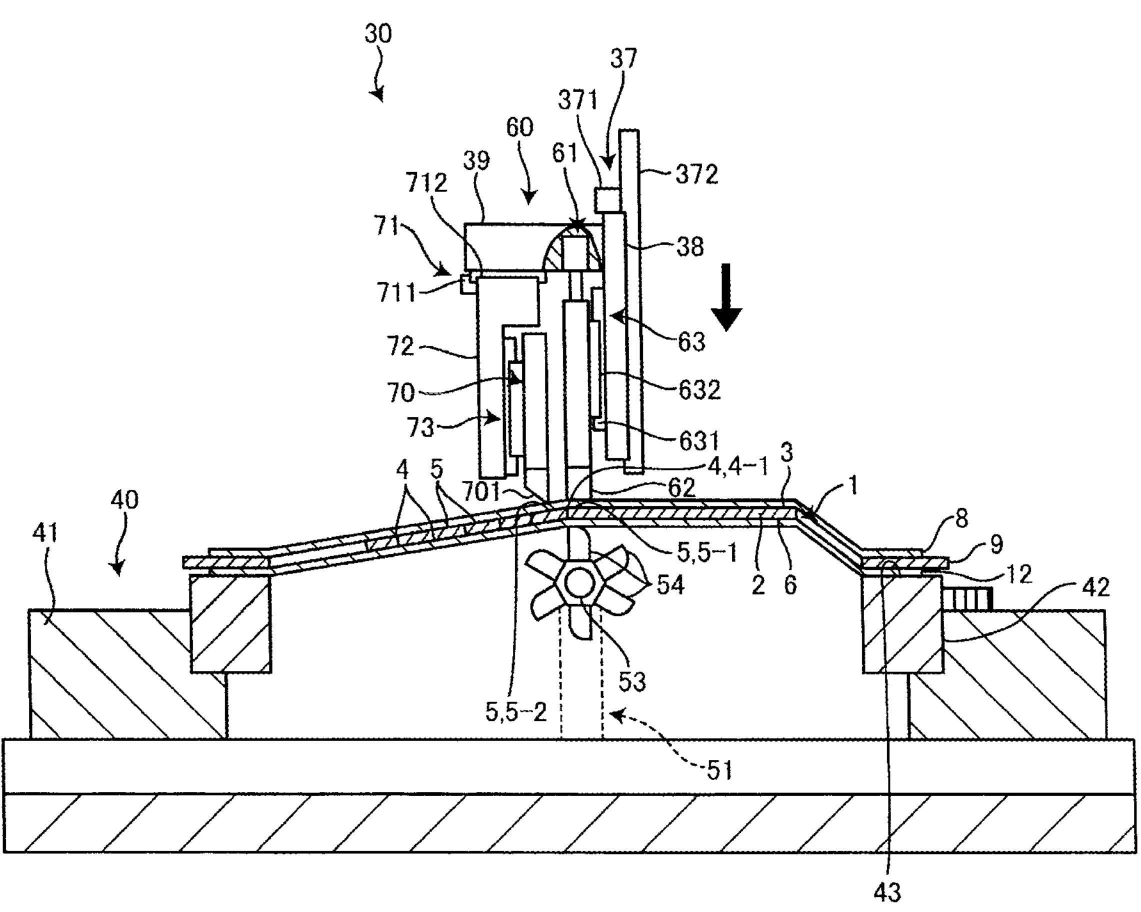
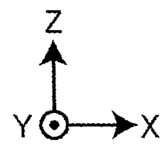

FIG. 18
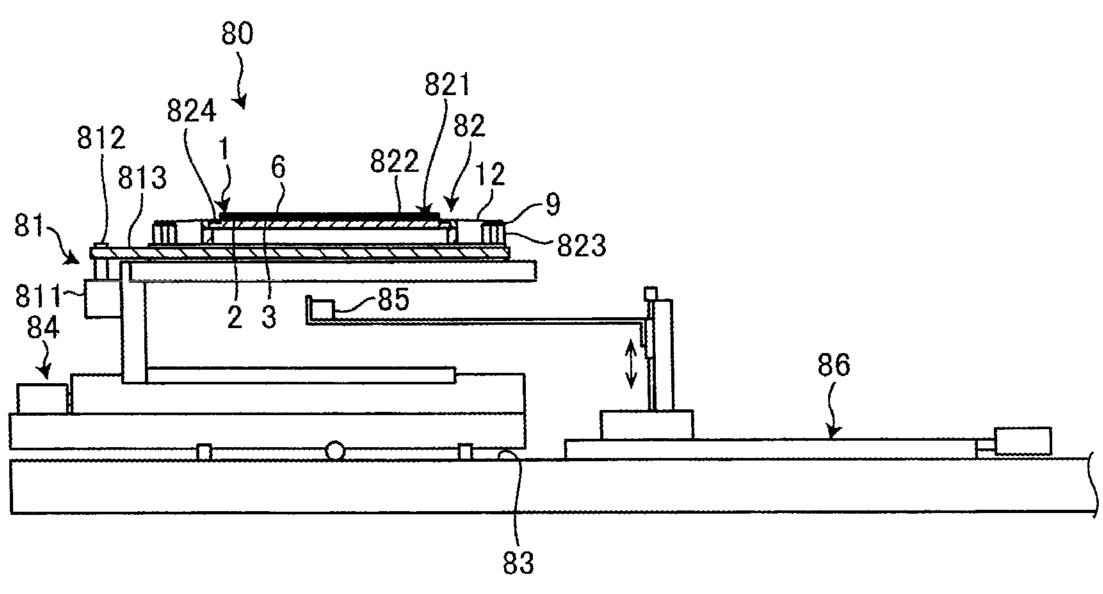
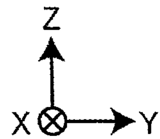

METHOD OF PROCESSING SiC WAFER

BACKGROUND OF THE INVENTION

Field of the Invention

The present invention relates to a method of processing a SiC wafer having a grid of projected dicing lines established on a face side thereof and a metal film layered on a reverse side thereof.

Description of the Related Art

SiC semiconductor devices that include a Sic substrate as a semiconductor substrate are in widespread use on the market. A plurality of SiC semiconductor devices are manufactured by constructing them on a SiC wafer and then dividing the SiC wafer into a plurality of device chips including the SiC semiconductor devices, respectively.

When a SiC wafer that is difficult to machine is cut into individual device chips by a cutting blade, the SiC wafer is liable to cause cracks referred to as chippings and the cutting blade tends to wear soon. In order to overcome the difficulties, there has been proposed a cutting method that cuts a SiC wafer with a cutting blade while applying ultrasonic vibrations to the cutting blade (see, for example, Japanese Patent Laid-open No. 2021-167046).

SUMMARY OF THE INVENTION

However, the cutting method disclosed in Japanese Patent Laid-open No. 2021-167046 needs improving as it requires a long period of time to cut the SiC wafer since it is difficult to increase the speed at which to cut the SiC wafer. The disclosed cutting method is also problematic with a SiC wafer having a metal film disposed on a reverse side thereof because the cutting blade is likely to be unduly loaded when it cuts the metal film, tending to lower quality with which the SiC wafer is processed by the cutting blade.

It is therefore an object of the present invention to provide a method of processing a SiC wafer so as to be able to reduce the period of time required to process the SiC wafer while preventing the quality with which to process the SiC wafer from being lowered.

In accordance with an aspect of the present invention, there is provided a method of processing a SiC wafer having a plurality of projected dicing lines established on a face side thereof and a metal film layered on a reverse side thereof. The method includes a laser processing step of applying a laser beam to the SiC wafer along the projected dicing lines to sever the metal film along the projected dicing lines and form grooves in the SiC wafer along the projected dicing lines, a tape mounting step of mounting a tape on the metal film before or after the laser processing step, and after the laser processing step and the tape mounting step, a dividing step of gripping, vertically between gripping members, an area of the SiC wafer adjacent to one at a time of the projected dicing lines along which the SiC wafer is to be divided and pressing, with a pressing member, an area of the SiC wafer adjacent to and across the one of the projected dicing lines from the gripping members, thereby dividing the SiC wafer along the one of the projected dicing lines.

Preferably, the tape mounting step is carried out before the laser processing step, and the laser processing step includes a step of holding the face side of the SiC wafer on a holding table and applying the laser beam through the tape to the metal film to sever the metal film along the projected dicing lines and form laser-processed grooves in the SiC wafer along the projected dicing lines.

Preferably, the laser beam applied to the SiC wafer in the laser processing step has an elliptical focused spot on the metal film, and the laser processing step includes a step of orienting a major axis of the elliptical focused spot in a direction along which the projected dicing line extends.

The method of processing a SiC wafer according to the present invention is advantageous in that the period of time required to process the SiC wafer is reduced while preventing the quality with which to process the SiC wafer from being lowered.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 6 is a fragmentary cross-sectional view schematically illustrating the SiC wafer after the laser processing step of the method illustrated in FIG. 2;

FIG. 7 is a fragmentary cross-sectional view schematically illustrating the SiC wafer after a tape mounting step of the method illustrated in FIG. 2;

FIG. 13 is a side elevational view, partly in cross section, schematically illustrating the manner in which the annular frame is fixed to a frame fixing unit in the dividing step of the method illustrated in FIG. 2;

FIG. 14 is a side elevational view, partly in cross section, schematically illustrating the manner in which devices adjacent to a projected dicing line along which the SiC wafer is to be divided are gripped between gripping members in the dividing step of the method illustrated in FIG. 2;

FIG. 15 is a side elevational view, partly in cross section, schematically illustrating the manner in which the SiC wafer has been divided along the projected dicing line in the dividing step of the method illustrated in FIG. 2;

FIG. 18 is a side elevational view, partly in cross section, schematically illustrating the manner in which a lower image capturing camera of a laser processing apparatus captures an image of a SiC wafer held on a holding table in a laser processing step of the method illustrated in FIG. 16;

DETAILED DESCRIPTION OF THE PREFERRED EMBODIMENTS

Figure 1:
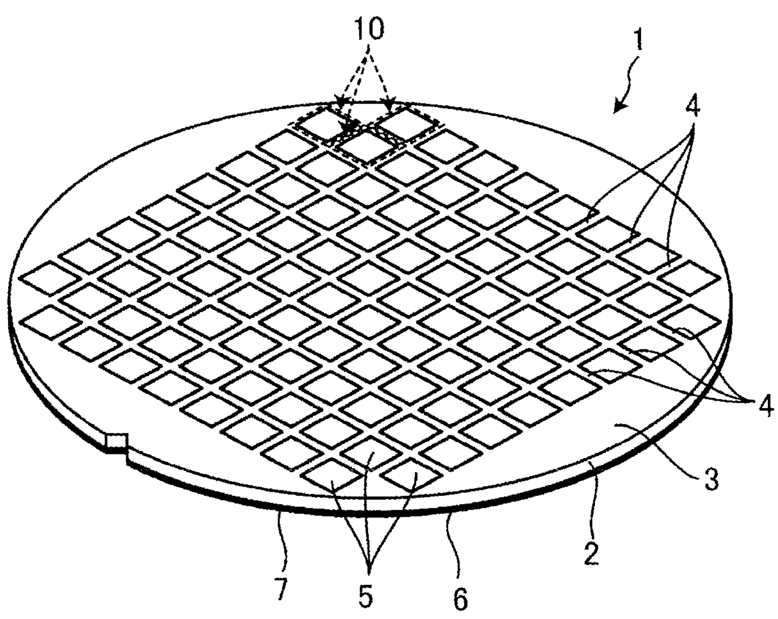
FIG. 1 is a perspective view illustrating, by way of example, a SiC wafer as an object to be processed by a method of processing a SiC wafer according to a first embodiment of the present invention.

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described below. Furthermore, the arrangements described below can be combined in appropriate manners. Various omissions, replacements, or changes of the arrangements may be made without departing from the scope of the present invention. In the description below, those components that are identical to each other are denoted by identical reference characters.

First Embodiment

Figure 2:
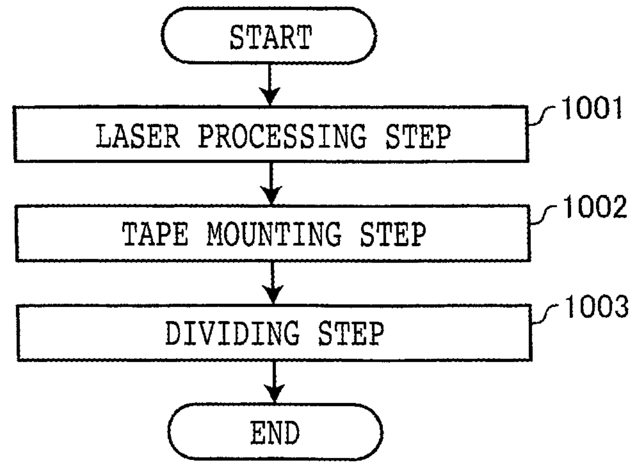
FIG. 2 is a flowchart illustrating a sequence of the method of processing a SiC wafer according to the first embodiment.

A method of processing a SiC wafer according to a first embodiment of the present invention will be described below with reference to the drawings. FIG. 1 illustrates, by way of example, in perspective, a SiC wafer 1 as an object to be processed by the method of processing a SiC wafer according to the first embodiment. FIG. 2 is a flowchart illustrating the sequence of the method of processing a SiC wafer according to the first embodiment.

The method of processing a SiC wafer according to the first embodiment refers to a method of processing the SiC wafer 1 illustrated in FIG. 1. According to the first embodiment, the SiC wafer 1 represents a wafer such as a semiconductor wafer shaped as a circular plate having a substrate 2 of silicon carbide (SiC). As illustrated in FIG. 1, the SiC wafer 1 has a grid of projected dicing lines 4 established on a face side 3 of the substrate 2 and a plurality of devices 5 constructed in respective areas demarcated on the face side 3 by the projected dicing lines 4.

The devices 5 represent integrated circuits (ICs), large-scale-integration (LSI) circuits, or memories such as semiconductor storage devices, for example.

According to the first embodiment, the SiC wafer 1 includes a metal film 7 layered on a reverse side 6 of the substrate 2 that is opposite the face side 3.

The method of processing a SiC wafer 1 according to the first embodiment also refers to a method of dividing the SiC wafer 1 into individual device chips 10 along the projected dicing lines 4. Each of the device chips 10 includes a portion of the substrate 2, one of the devices 5 on the substrate 2, and a portion of the metal film 7 on the reverse side 6 of the substrate 2. As illustrated in FIG. 2, the method of processing a SiC wafer according to the first embodiment includes a laser processing step 1001, a tape mounting step 1002, and a dividing step 1003.

Figure 3:
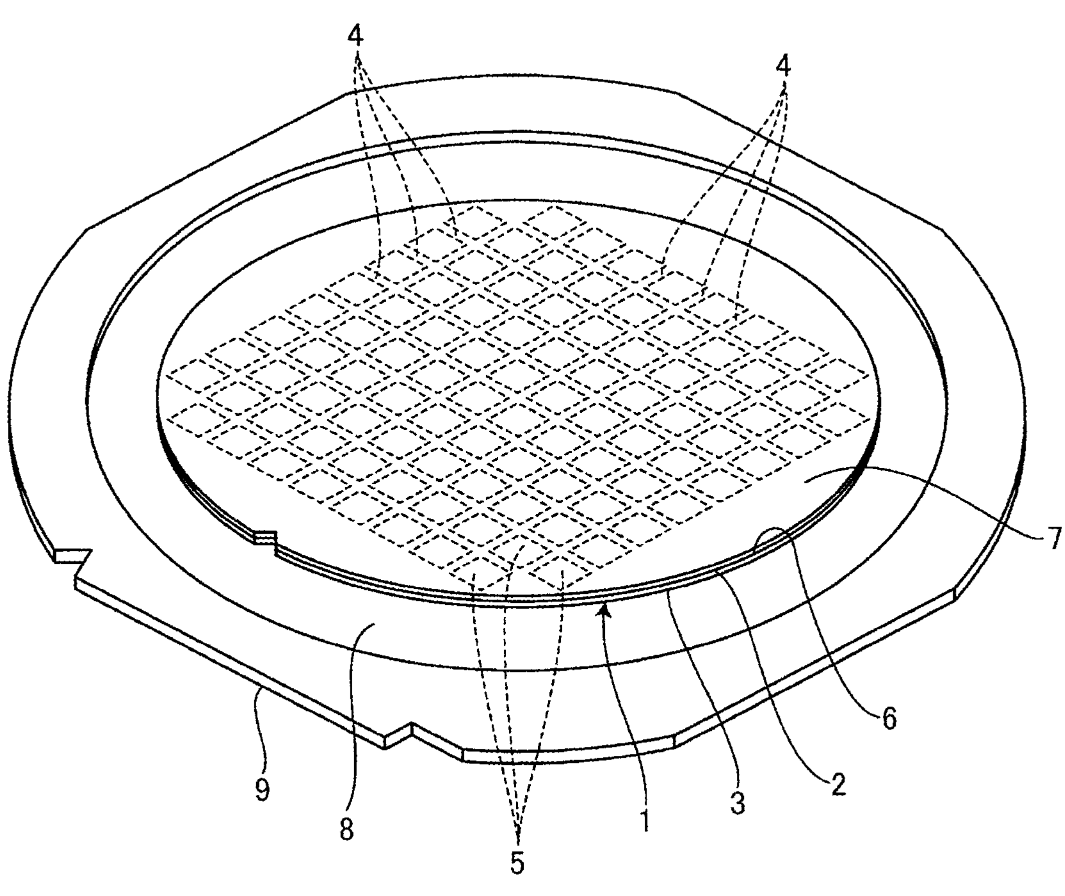
FIG. 3 is a perspective view schematically illustrating the manner in which a tape is affixed to a face side of the SiC wafer and an annular frame is affixed to an outer edge of the tape in a laser processing step of the method illustrated in FIG. 2.
Figure 4:
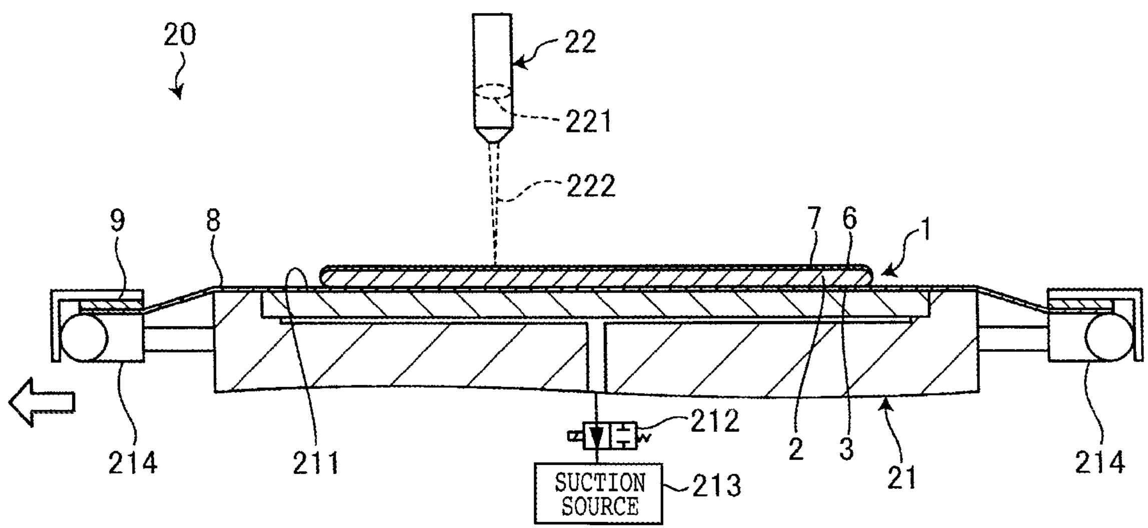
FIG. 4 is a side elevational view, partly in cross section, schematically illustrating the manner in which a groove is formed in a metal film of the SiC wafer in the laser processing step of the method illustrated in FIG. 2.
Figure 5:
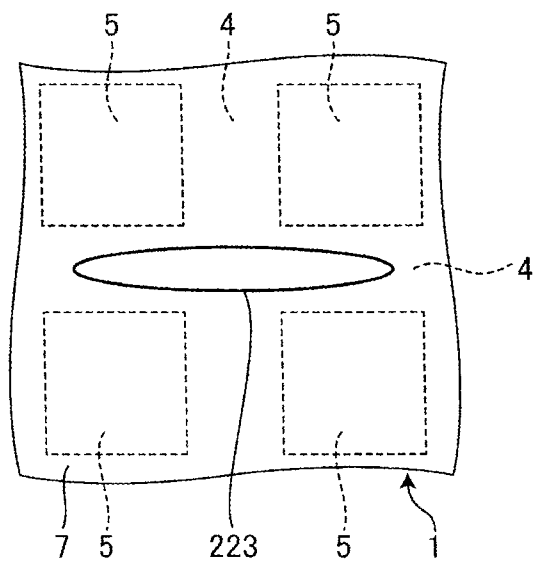
FIG. 5 is a fragmentary plan view schematically illustrating a spot configuration of a laser beam applied to the SiC wafer in the laser processing step of the method illustrated in FIG. 2.

FIG. 3 schematically illustrates, in perspective, the manner in which a tape 8 is affixed to the face side of the SiC wafer 1 and an annular frame 9 is affixed to an outer edge of the tape 8 in the laser processing step 1001 of the method illustrated in FIG. 2. FIG. 4 schematically illustrates, in side elevation, partly in cross section, the manner in which a groove is formed in the metal film 7 of the SiC wafer 1 in the laser processing step 1001 of the method illustrated in FIG. 2. FIG. 5 schematically illustrates, in fragmentary plan, a spot configuration of a laser beam 222 applied to the SiC wafer 1 in the laser processing step 1001 of the method illustrated in FIG. 2. FIG. 6 schematically illustrates, in fragmentary cross section, the SiC wafer 1 after the laser processing step 1001 of the method illustrated in FIG. 2.

The laser processing step 1001 is a step of applying a laser beam 222 (see FIG. 4) to the SiC wafer 1 along the projected dicing lines 4 to sever the metal film 7 along the projected dicing lines 4 and form grooves 11 (see FIG. 6, also referred to as laser-processed grooves) in the SiC wafer 1 along the projected dicing lines 4. According to the first embodiment, in the laser processing step 1001, first, as illustrated in FIG. 3, the tape 8 that is of a circular shape larger in diameter than the SiC wafer 1 is affixed in its central portion to the face side 3 of the SiC wafer 1, and the annular frame 9 that is larger in diameter than the SiC wafer 1 is affixed to the outer edge of the tape 8 such that the SiC wafer 1 is positioned within the opening of the annular frame 9.

According to the first embodiment, the tape 8 refers to an adhesive tape including a base made of a non-adhesive and flexible resin and a glue layer disposed on the base and made of an adhesive and flexible resin, the glue layer being affixed to the SiC wafer 1 and the annular frame 9, or a sheet free of a glue layer and including only a base made of a thermoplastic resin, the base being affixed by way of thermocompression bonding to the SiC wafer 1 and the annular frame 9.

According to the first embodiment, the annular frame 9 is made of a non-flexible hard material, specifically, a metal having magnetic properties.

According to the first embodiment, in the laser processing step 1001, a laser processing apparatus 20 illustrated in FIG. 4 opens an on-off valve 212 to transmit a negative pressure from a suction source 213 to a holding table 21 to hold the face side 3 of the SiC wafer 1 under suction on a holding surface 211 of the holding table 21, and actuates clamps 214 disposed around the holding table 21 to grip the annular frame 9 to secure the annular frame 9 in place. Then, the laser processing apparatus 20 energizes an image capturing camera 46 to capture an image of the SiC wafer 1, and then performs an alignment process for positioning one of the projected dicing lines 4 of the SiC wafer 1 with respect to a condensing lens 221 as a beam condenser of a laser beam applying unit 22 on the basis of the captured image. According to the present invention, in the laser processing step 1001, as with a second embodiment to be described later, the holding table 21 may be made of a transparent material, and an image of the SiC wafer 1 held on the holding table 21 may be captured by an image capturing camera disposed below the holding table 21, after which the alignment process may be carried out on the basis of the image thus captured.

Then, in the laser processing step 1001, as illustrated in FIG. 4, the laser processing apparatus 20 applies the laser beam 222 from the laser beam applying unit 22 to the metal film 7 along each of the projected dicing lines 4, while moving the holding table 21 and the laser beam applying unit 22 relatively to each other along the projected dicing line 4, thereby severing the metal film 7 along the projected dicing line 4 by way of ablation. According to the present embodiment, in the laser processing step 1001, the laser beam 222 emitted from a laser oscillator, not depicted, of the laser beam applying unit 22 has a wavelength of 355 nm, for example, absorbable by the metal film 7 and a repetitive frequency of 120 kHz, the SiC wafer 1 is moved, i.e., processing-fed, along the projected dicing line 4 at a processing feed speed of 150 mm/s, the condensing lens 221 has a numerical aperture (NA) of 0.065, and the laser oscillator has an output power level of 3.9 W for the laser beam 222.

As illustrated in FIG. 5, the laser beam 222 applied to the metal film 7 in the laser processing step 1001 has an elliptical focused spot 223 on the face side of the metal film 7. The elliptical focused spot 223 on the face side of the metal film 7 has a major axis, i.e., a longer axis, oriented in the direction along which the projected dicing line 4 extends, i.e., in the longitudinal direction thereof. Specifically, the laser oscillator emits a laser beam having a circular spot shape, and the laser beam emitted from the laser oscillator is shaped into the laser beam 222 having the elliptical focused spot 223 by a plano-concave cylindrical lens and a plano-convex cylindrical lens, a mask, or a plurality of rectangular prisms. By severing the metal film 7 along the projected dicing lines 4 by way of ablation, as illustrated in FIG. 6, the laser processing apparatus 20 forms a plurality of grooves 11 in the metal film 7 and the substrate 2 along the respective projected dicing lines 4 over their entire length. The grooves 11 sever the metal film 7 and remove part of the substrate 2, exposing the substrate 2 at their bottoms.

FIG. 7 illustrates, in fragmentary cross section, the SiC wafer 1 after the tape mounting step 1002 of the method illustrated in FIG. 2. The tape mounting step 1002 is a step of mounting a tape 12 on the metal film 7 after the laser processing step 1001. The tape 12 is of a circular shape larger in diameter than the SiC wafer 1. According to the first embodiment, in the tape mounting step 1002, the tape 12 is affixed in its central portion to the metal film 7, and the annular frame 9 is affixed to an outer edge of the tape 12, as illustrated in FIG. 7.

According to the first embodiment, as with the tape 8, the tape 12 refers to an adhesive tape including a base made of a non-adhesive and flexible resin and a glue layer disposed on the base and made of an adhesive and flexible resin, the glue layer being affixed to the SiC wafer 1 and the annular frame 9, or a sheet free of a glue layer and including only a base made of a thermoplastic resin, the base being affixed by way of thermocompression bonding to the sic wafer 1 and the annular frame 9.

Figure 8:
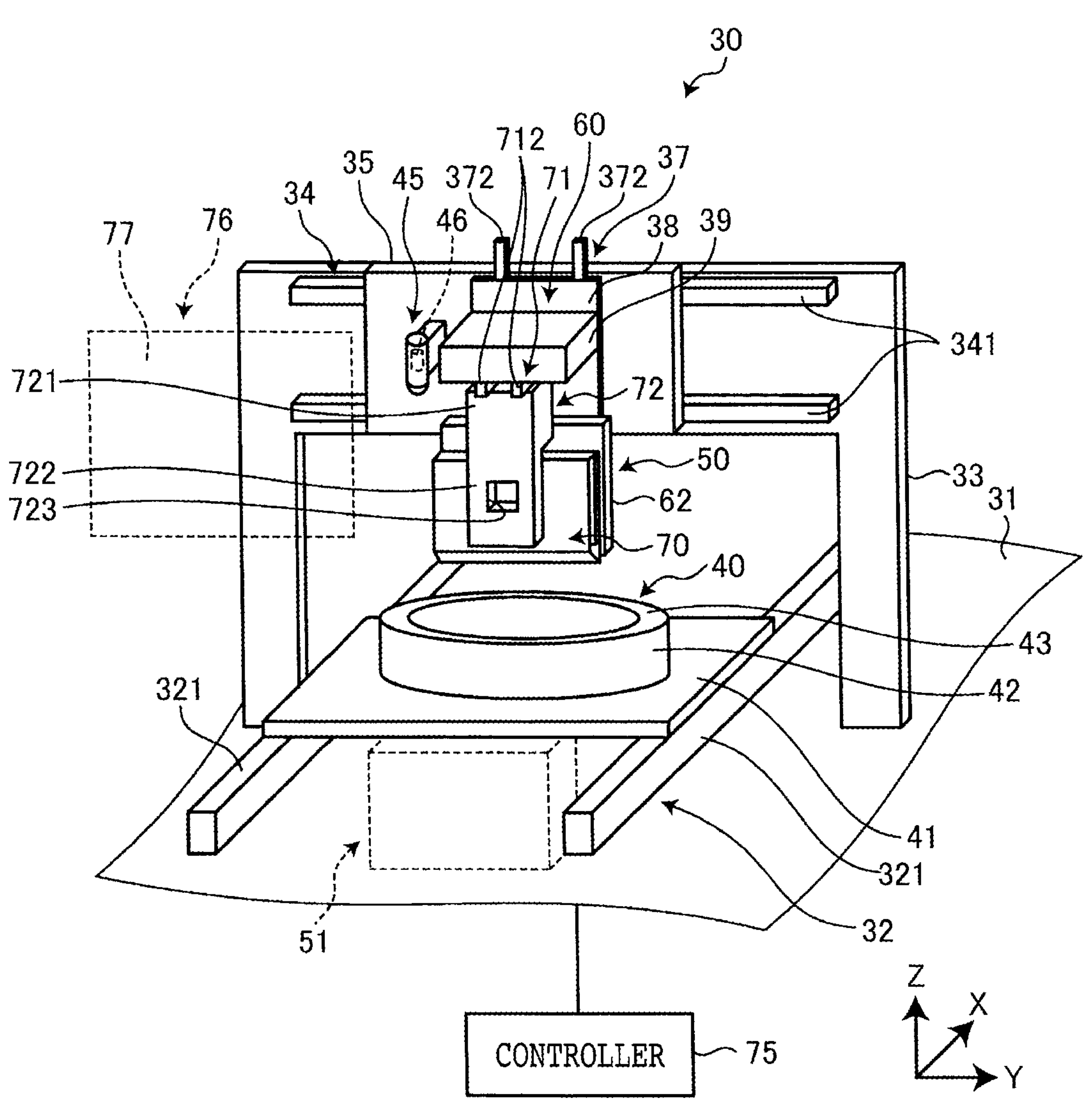
FIG. 8 is a perspective view schematically illustrating a structural example of a breaking apparatus that carries out a dividing step of the method illustrated in FIG. 2.
Figure 9:
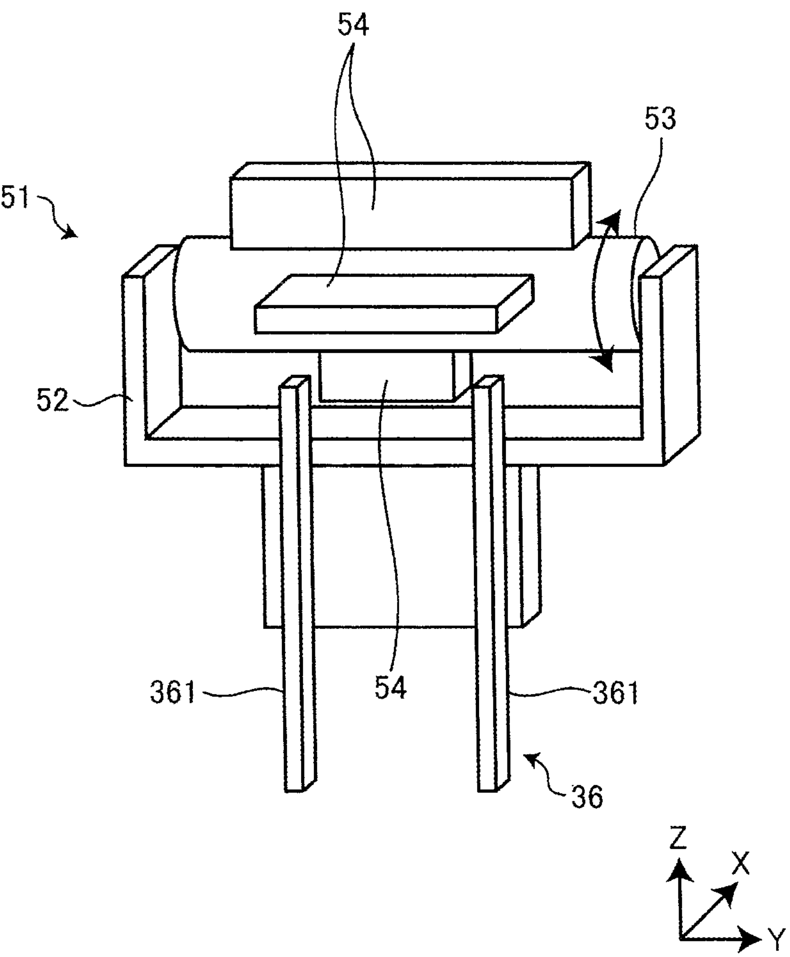
FIG. 9 is a perspective view schematically illustrating the structure of a lower gripping unit of a gripping assembly of the breaking apparatus illustrated in FIG. 8.
Figure 10:
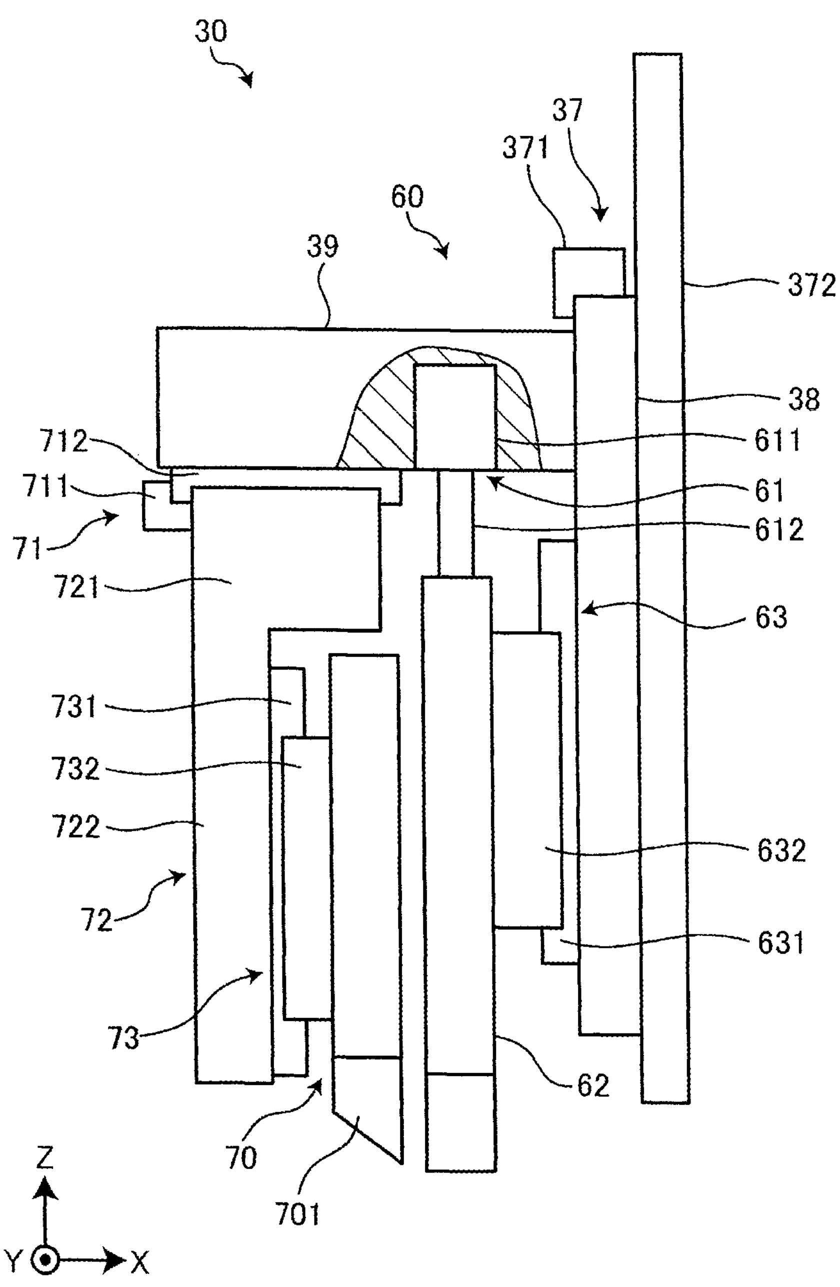
FIG. 10 is a side elevational view schematically illustrating the structure of an upper gripping unit of the gripping assembly of the breaking apparatus illustrated in FIG. 8.
Figure 11:
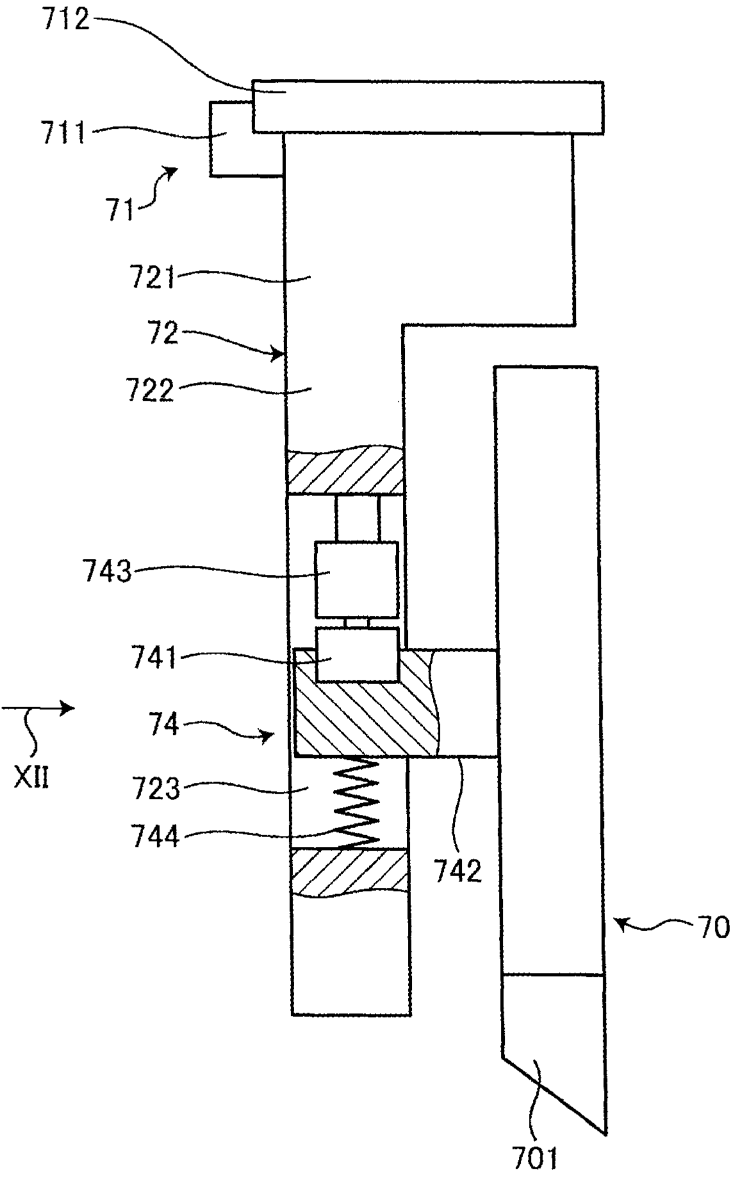
FIG. 11 is a side elevational view, partly in cross section, schematically illustrating a pressing member of the breaking apparatus illustrated in FIG. 8.
Figure 12:
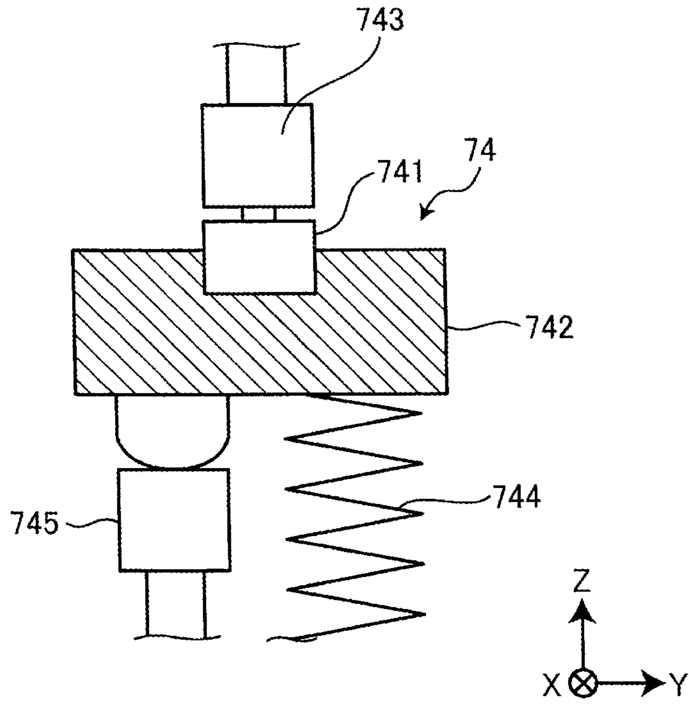
FIG. 12 is a front elevational view, partly in cross section, schematically illustrating a load measuring unit as viewed in the direction indicated by the arrow XII in FIG. 11.

A breaking apparatus 30 illustrated in FIG. 8 for carrying out the dividing step 1003 will be described below. FIG. 8 schematically illustrates, in perspective, a structural example of the breaking apparatus 30 that carries out the dividing step 1003 of the method illustrated in FIG. 2. FIG. 9 schematically illustrates, in perspective, the structure of a lower gripping unit 51 of a gripping assembly 50 of the breaking apparatus 30 illustrated in FIG. 8. FIG. 10 schematically illustrates, in side elevation, the structure of an upper gripping unit 60 of the gripping assembly 50 of the breaking apparatus 30 illustrated in FIG. 8. FIG. 11 schematically illustrates, in side elevation, partly in cross section, a pressing member 70 of the breaking apparatus 30 illustrated in FIG. 8. FIG. 12 schematically illustrates, in front elevation view, partly in cross section, a load measuring unit 74 as viewed in the direction indicated by the arrow XII in FIG. 11.

The breaking apparatus 30 illustrated in FIG. 8 is an apparatus for breaking the SiC wafer 1 along the projected dicing lines 4 to divide the SiC wafer 1 into the individual device chips 10. As illustrated in FIG. 8, the breaking apparatus 30 includes a frame fixing unit 40, a detecting unit 45, a gripping assembly 50, a pressing member 70, a controller 75, a display unit 76, and an input unit, not depicted.

The frame fixing unit 40 fixes the annular frame 9 in position thereon. The frame fixing unit 40 includes a movable frame 41 movable along an X-axis indicated by the arrow X parallel to horizontal directions by an X-axis moving unit 32 on an apparatus base 31, and a frame fixing member 42 disposed on the movable frame 41.

The frame fixing member 42 is of an annular shape whose inside and outside diameters are equal to those of the annular frame 9, and has an upper surface as a holding surface 43 on which the annular frame 9 is to be placed with the outer edge of the tape 12 interposed therebetween. When the annular frame 9 is placed on the holding surface 43 of the frame fixing member 42, the tape 12 affixed to the metal film 7 on the reverse side 6 of the substrate 2 faces downwardly, and the tape 8 on the face side 3 of the substrate 2 faces upwardly, as illustrated in FIG. 13. The holding surface 43 lies flatwise along horizontal directions. According to the first embodiment, the frame fixing member 42 has suction holes, not depicted, defined therein that are open in the holding surface 43 and are fluidly connected to a suction source, not depicted.

When the suction holes in the frame fixing member 42 are evacuated by the suction source, the frame fixing member 42 secures the annular frame 9 under suction on the holding surface 43 with the tape 12 interposed therebetween. According to the present invention, providing the annular frame 9 is made of a magnetic material, the frame fixing unit 40 may include magnets, e.g., permanent magnets or electromagnets, disposed in the frame fixing member 42 for magnetically attracting the annular frame 9 placed on the holding surface 43. Providing the annular frame 9 is made of a non-magnetic material, the frame fixing unit 40 may include a clamp mechanism for gripping the annular frame 9 between itself and the holding surface 43 to secure the annular frame 9 in place. The frame fixing unit 40 is rotatable by a rotary actuator, not depicted, operatively coupled thereto about a central axis thereof parallel to a Z-axis indicated by the arrow Z and extending vertically.

The X-axis moving unit 32 includes a known ball screw, not depicted, mounted on the apparatus base 31 and rotatable about a central axis thereof, a known electric motor, not depicted, coupled to an end of the ball screw for rotating the ball screw about the central axis thereof to move the movable frame 41 and the frame fixing member 42 along the X-axis, and a pair of known guide rails 321 mounted on the apparatus base 31 and supporting thereon the movable frame 41 for movement along the X-axis.

The detecting unit 45 detects projected dicing lines 4 of the SiC wafer 1 combined with the annular frame 9 secured in place by the frame fixing unit 40 by capturing an image of the projected dicing lines 4. The detecting unit 45 is mounted on a Y-axis movable table 35 movable along a Y-axis indicated by the arrow Y parallel to horizontal directions and perpendicular to the X-axis by a Y-axis moving unit 34 on a portal-shaped frame 33 that is erected from the apparatus base 31 and extends across and over the guide rails 321 of the X-axis moving unit 32. The detecting unit 45 mounted on the Y-axis movable table 35 is also movable in unison therewith along the Y-axis by the Y-axis moving unit 34.

The detecting unit 45 includes an image capturing camera 46 having an image capturing device, not depicted, such as a charge-coupled-device (CCD) image sensor or a complementary metal oxide semiconductor (CMOS) image sensor including an objective lens oriented along the Z-axis. The detecting unit 45 acquires an image captured by the image capturing device of the image capturing camera 46, and outputs the acquired image to the controller 75. The detecting unit 45 also acquires an image captured by the image capturing device of the image capturing camera 46 of the SiC wafer 1 disposed in the opening of the annular frame 9 secured to the frame fixing unit 40. The image thus acquired will be used in an alignment process for positioning one of the projected dicing lines 4 of the SiC wafer 1 and the pressing member 70 with respect to each other.

The portal-shaped frame 33 and the Y-axis movable table 35 are shaped as flat plates having respective face sides, which face the viewer of FIG. 8, extending parallel to the Z-axis, and are spaced from each other along the X-axis and lie parallel to each other, one over the other. The Y-axis moving unit 34 includes a known ball screw, not depicted, mounted on the portal-shaped frame 33 and rotatable about a central axis thereof, a known electric motor, not depicted, coupled to an end of the ball screw for rotating the ball screw about the central axis thereof to move the Y-axis movable table 35 along the Y-axis, and a pair of known guide rails 341 mounted on the portal-shaped frame 33 and supporting thereon the Y-axis movable table 35 for movement along the Y-axis.

The gripping assembly 50 grips, vertically along the Z-axis, those devices 5 of the SiC wafer 1 that are present in an area that is disposed adjacent to one of the projected dicing lines 4 along which the SiC wafer 1 is to be divided. As illustrated in FIG. 8, the gripping assembly 50 includes a lower gripping unit 51 and an upper gripping unit 60.

The lower gripping unit 51, which is disposed below the frame fixing unit 40, presses from below the devices 5 in the area adjacent to one of the projected dicing lines 4, referred to as “projected dicing line 4-1” (see FIG. 13, for example), along which the SiC wafer 1 disposed in the opening of the annular frame 9 secured to the frame fixing unit 40 is to be divided. As illustrated in FIG. 9, the lower gripping unit 51 includes a bracket 52 that can be lifted and lowered by a Z-axis moving unit 36, a rotor 53 rotatably supported on the bracket 52 for rotation about a central axis parallel to the Y-axis, and a plurality of rectangular gripping members 54 protruding radially outwardly from an outer circumferential surface of the rotor 53 and having respective different lengths along the Y-axis.

The rotor 53 has its central axis extending parallel to the Y-axis and has opposite axial ends rotatably supported on the bracket 52. The rotor 53 is rotatable about its central axis by a rotary actuator, not depicted, operatively coupled to the rotor 53. The rectangular gripping members 54, each straight and rectangular in shape along the Y-axis, have respective constant thicknesses and extend over different lengths along the Y-axis. The longest one of the rectangular gripping members 54 is equal in length to the longest one of the projected dicing lines 4 of the SiC wafer 1, and the shortest one of the rectangular gripping members 54 is equal in length to the shortest one of the projected dicing lines 4 of the SiC wafer 1.

The directions along which the rectangular gripping members 54 protrude radially outwardly from the rotor 53 vary as the rotor 53 rotates about its central axis. When one of the rectangular gripping members 54 that is directed upwardly along the Z-axis is lowered by the Z-axis moving unit 36, its upper end can be positioned below the tape 12 affixed to the metal film 7 of the SiC wafer 1 in the opening of the annular frame 9 secured in place by the frame fixing unit 40. At this time, the SiC wafer 1 is supported by the annular frame 9 to lie flatwise in a horizontal plane. When the same rectangular gripping member 54 is lifted by the Z-axis moving unit 36, its upper end can be positioned above the horizontal plane in which the SiC wafer 1 would lie flatwise. While the SiC wafer 1 is being supported by the annular frame 9 on the frame fixing unit 40, when the same rectangular gripping member 54 is lifted by the Z-axis moving unit 36, its upper end presses upwardly the devices 5 adjacent to the projected dicing line 4-1 along which the SiC wafer 1 is to be divided, through the tape 12, the metal film 7, and the substrate 2.

The lower gripping unit 51 can thus select one of the rectangular gripping members 54 that is to be directed upwardly along the Z-axis, thereby selecting its length along the Y-axis, by turning the rotor 53 about its central axis, and cause the selected rectangular gripping member 54 to press upwardly the devices 5 adjacent to the projected dicing line 4-1 along which the SiC wafer 1 is to be divided.

The Z-axis moving unit 36 includes a known ball screw, not depicted, rotatable about a central axis thereof, a known electric motor, not depicted, coupled to an end of the ball screw for rotating the ball screw about the central axis thereof to selectively lift and lower the bracket 52, and a pair of known guide rails 361 supporting thereon the bracket 52 for movement along the Z-axis.

The upper gripping unit 60 is disposed above the frame fixing unit 40. The upper gripping unit 60 cooperates with the lower gripping unit 51 in gripping therebetween the devices 5 positioned adjacent to the projected dicing line 4-1 of the SiC wafer 1 and pressed upwardly by the lower gripping unit 51, while the SiC wafer 1 is being disposed in the opening of the annular frame 9 secured in place by the frame fixing unit 40. The upper gripping unit 60 is mounted on a movable base 38 that is movably supported on the Y-axis movable table 35 for being moved along the Z-axis by a lifting and lowering unit 37.

The movable base 38 is shaped as a flat plate having front and rear surfaces lying parallel to the Z-axis and is spaced from and disposed over the movable table 35. A horizontal member 39 having upper and lower surfaces that lie horizontally are fixed to the front surface of the movable base 38.

The lifting and lowering unit 37 includes a known ball screw, not depicted, mounted on the movable table 35 and rotatable about a central axis thereof, a known electric motor, not depicted, coupled to an end of the ball screw for rotating the ball screw about the central axis thereof to move the movable base 38 along the Z-axis, and a pair of known guide rails 372 mounted on the movable table 35 and supporting thereon the movable base 38 for movement along the Z-axis.

As illustrated in FIG. 10, the upper gripping unit 60 includes a cylinder unit 61, an upper gripping member 62, which correspond to a gripping member, and a slide unit 63. The cylinder unit 61 includes a cylinder 611 fixed to the horizontal member 39, and a rod 612 protruding downwardly from the cylinder 611 parallel to the Z-axis and operatively, i.e., extensibly and retractably, coupled to the cylinder 611. When the rod 612 is extended downwardly from the cylinder 611, the rod 612 has its lower end lowered.

The upper gripping member 62 is shaped as a rectangular plate that is of a constant thickness and extends straight along the Y-axis, and has front and rear surfaces lying parallel to the Z-axis. The length of the upper gripping member 62 along the Y-axis is equal to the length of the longest projected dicing line 4 of the SiC wafer 1. The upper gripping member 62 has an upper end fixed to the lower end of the rod 612 of the cylinder unit 61. The upper gripping member 62 is spaced from and disposed over the movable base 38. The upper gripping member 62 faces the upwardly directed one of the rectangular gripping members 54 along the Z-axis, i.e., is vertically aligned with the rotor 53.

The upper gripping member 62 is slidably supported on the slide unit 63 such that the upper gripping member 62 is slidable along the Z-axis relatively to the movable base 38. The slide unit 63 includes a straight guide rail 631 fixed to one of the movable base 38 and the upper gripping member 62, e.g., the movable base 38, and extending parallel to the Z-axis, and a slider 632 fixed to the other of the movable base 38 and the upper gripping member 62, e.g., the upper gripping member 62, and slidably supported on the guide rail 631 for sliding movement along the longitudinal directions of the guide rail 631, i.e., along the Z-axis.

When the upper gripping member 62 is lifted by the lifting and lowering unit 37 with the rod 612 being extended, the upper gripping member 62 has its lower end positioned above the SiC wafer 1 disposed in the opening of the annular frame 9 secured to the frame fixing unit 40. When the upper gripping member 62 is lowered by the lifting and lowering unit 37, the lower end of the upper gripping member 62 grips, between itself and the upwardly directed rectangular gripping member 54, the devices 5 adjacent to the projected dicing line 4-1 along which the SiC wafer 1 is to be divided, the devices 5 being pressed upwardly by the upwardly directed rectangular gripping member 54.

The pressing member 70 presses those devices 5 of the SiC wafer 1 that are present in an area that is disposed adjacent to and across the projected dicing line 4-1 from the gripping members 54 and 62 along the X-axis, and breaks, i.e., divides, the SiC wafer 1 along the projected dicing line 4-1. As illustrated in FIG. 10, the pressing member 70 is mounted on a pressing movable base 72 disposed on the horizontal member 39 and movable along the X-axis by a second X-axis moving unit 71.

The pressing movable base 72 has front and rear surfaces lying parallel to the Z-axis, has an integral thicker portion 721 near its upper end and an integral thinner portion 722 near its lower end, and is spaced from and disposed over the upper gripping member 62. According to the first embodiment, the thicker portion 721 and the thinner portion 722 have respective surfaces remoter from the upper gripping member 62 that lie flush with each other, and respective surfaces closer to the upper gripping member 62 with a step provided between those closer surfaces. According to the first embodiment, furthermore, the thinner portion 722 has an opening 723 (see FIG. 11) defined therein that extends therethrough along the X-axis and having a rectangular planar shape along the X-axis.

The second X-axis moving unit 71 includes a known ball screw, not depicted, mounted on the horizontal member 39 and rotatable about a central axis thereof, a known electric motor 711, not depicted, coupled to an end of the ball screw for rotating the ball screw about the central axis thereof to move the pressing movable base 72 along the X-axis, and a pair of known guide rails 712 mounted on the horizontal member 39 and supporting thereon the pressing movable base 72 for movement along the X-axis.

The pressing member 70 is shaped as a rectangular plate that is straight along the Y-axis and has front and rear surfaces lying parallel to the Z-axis. The length of the pressing member 70 along the Y-axis is equal to the length of the longest projected dicing line 4 of the SiC wafer 1. The pressing member 70 has a distal end portion 701 that is progressively smaller in thickness in a downward direction. According to the first embodiment, the distal end portion 701 has a surface that is closer to the upper gripping member 62 and that lies flatwise along the Z-axis and an opposite surface that is remoter from the upper gripping member 62 and that is tapered progressively toward the upper gripping member 62 with respect to the X-axis and the Z-axis.

The pressing member 70 is slidably supported on the pressing movable base 72 by a pair of slide units 73 for sliding movement along the Z-axis. The slide units 73 are spaced apart from each other along the Y-axis. Each of the slide units 73 includes a straight guide rail 731 fixed to one of the pressing movable base 72 and the pressing member 70, e.g., the pressing movable base 72, and extending parallel to the Z-axis, and a slider 732 fixed to the other of the pressing movable base 72 and the pressing member 70, e.g., the pressing member 70, and slidably supported on the guide rail 731 for sliding movement along the longitudinal directions of the guide rail 731, i.e., along the Z-axis.

When the pressing member 70 is lifted by the lifting and lowering unit 37, the pressing member 70 has its lower end positioned above the SiC wafer 1 disposed in the opening of the annular frame 9 secured in place by the frame fixing unit 40. When the pressing member 70 is lowered by the lifting and lowering unit 37, the lower end of the pressing member 70 presses downwardly the devices 5 of the SiC wafer 1 that position the projected dicing line 4-1 between the gripping members 54 and 62 along the X-axis. According to the first embodiment, the pressing member 70 presses downwardly the position on the SiC wafer 1 that is spaced from the upper gripping member 62 along the X-axis by a distance that is approximately in the range from 75% to 85% of the width of the device chips 10. According to the present invention, however, the pressing member 70 may press downwardly the position on the SiC wafer 1 that is spaced from the upper gripping member 62 along the X-axis by a distance that is approximately in the range from 65% to 95% of the width of the device chips 10.

If the position on the SiC wafer that is pressed downwardly by the pressing member 70 is too close to the upper gripping member 62 along the X-axis, then the pressing member 70 would be unlikely to break or divide the SiC wafer 1. If the position on the SiC wafer 1 that is pressed downwardly by the pressing member 70 is too far from the upper gripping member 62 along the X-axis, then the pressing member 70 would be liable to shift away from those projected dicing lines 4 along which the SiC wafer 1 has already been divided, and fail to break or divide the SiC wafer 1. It is thus desirable for the pressing member 70 to press downwardly the position on the SiC wafer 1 that is spaced from the upper gripping member 62 along the X-axis by a distance that is approximately in the range from 65% to 95% of the width of the device chips 10, preferably the position on the SiC wafer 1 that is spaced from the upper gripping member 62 along the X-axis by a distance that is approximately in the range from 75% to 85% of the width of the device chips 10. When lowered by the lifting and lowering unit 37, the pressing member 70 presses downwardly the devices 5 of the SiC wafer 1 that position the projected dicing line 4-1 between the gripping members 54 and 62 along the X-axis.

As illustrated in FIG. 11, the pressing member 70 is fixed to the pressing movable base 72 by a load measuring unit 74. The load measuring unit 74 is disposed between the slide units 73. As illustrated in FIGS. 11 and 12, the load measuring unit 74 includes a load gage 741 for measuring the value of a load (hereinafter referred to as "load value") by which the pressing member 70 presses the SiC wafer 1, a holder 742, a support member 743, a spring 744, and a support member 745 (only depicted in FIG. 12).

The load gage 741 measures a load value by which the pressing member 70 presses the SiC wafer 1 along the Z-axis. According to the first embodiment, the load gage 741 is represented by a known load cell. According to the present invention, the load gage 741 is not limited to a load cell. The load gage 741 outputs a measured load value to the controller 75. The load gage 741 is disposed in the opening 723 of the pressing movable base 72.

The holder 742 has an end secured to the pressing member 70 and extends from the pressing member 70 toward the pressing movable base 72, and an opposite end is disposed in the opening 723 of the pressing movable base 72. The end of the holder 742 that is disposed in the opening 723 supports a lower end of the load gage 741 thereon.

The support member 743 is disposed in the opening 723 of the pressing movable base 72, and has an upper end fixed to an upper inner surface of the thinner portion 722 that defines an upper end of the opening 723 and a lower end supporting an upper end of the load gage 741. The support member 745 is disposed in the opening 723 of the pressing movable base 72, and has a lower end fixed to a lower inner surface of the thinner portion 722 that defines a lower end of the opening 723 and an upper end supporting a lower end of the holder 742.

The spring 744 is disposed between the lower inner surface of the thinner portion 722 that defines the lower end of the opening 723 and the end of the holder 742 that is disposed in the opening 723. The spring 744 normally urges the pressing member 70 to move upwardly relatively to the pressing movable base 72 through the end of the holder 742 that is disposed in the opening 723. According to the first embodiment, the spring 744 normally urges the holder 742 and the pressing member 70 to move upwardly with a force corresponding to the combined mass of the pressing member 70, the holder 742, and the load gage 741. The force with which the spring 744 normally urges the holder 742 and the pressing member 70 to move upwardly cancels out the combined mass of the pressing member 70, the holder 742, and the load gage 741, allowing the load gage 741 to measure a load value smaller than the combined mass of the pressing member 70, the holder 742, and the load gage 741. As described above, the breaking apparatus 30 includes the load gage 741 that measures a load value by which the pressing member 70 presses the SiC wafer 1.

The controller 75 controls the above components of the breaking apparatus 30 to enable the breaking apparatus 30 to divide the SiC wafer 1 along the projected dicing lines 4. The controller 75 is provided by a computer including a processing device having a microprocessor such as a central processing unit (CPU), a storage device having a memory such as a read only memory (ROM) or a random access memory (RAM), and an input/output interface device. The processing device of the controller 75 carries out processing operations according to computer programs stored in the storage device to generate and output control signals for controlling the components of the breaking apparatus 30 through the input/output interface device to those components. The processing device of the controller 75 also determines the results of a dividing process for dividing the SiC wafer 1 along the projected dicing lines 4 on the basis of the load values measured by the load gage 741 and stores the results as linked with the projected dicing lines 4 in one-to-one correspondence.

The display unit 76 is electrically connected to the controller 75 and includes a display screen 77 for displaying various pieces of information. The input unit is used by the operator to enter information to be input to the controller 75. The input unit is electrically connected to the controller 75 and outputs entered information to the controller 75. The input unit includes a touch panel, not depicted, placed over the display screen 77 of the display unit 76.

The dividing step 1003 will be described below. FIG. 13 schematically illustrates, in side elevation, partly in cross section, the manner in which the annular frame 9 is fixed to the frame fixing unit 40 in the dividing step 1003 of the method illustrated in FIG. 2. FIG. 14 schematically illustrates, in side elevation, partly in cross section, the manner in which the devices 5 adjacent to the projected dicing line 4-1 along which the SiC wafer 1 is to be divided are gripped between the gripping members 54 and 62 in the dividing step 1003 of the method illustrated in FIG. 2. FIG. 15 schematically illustrates, in side elevation, partly in cross section, the manner in which the SiC wafer 1 has been divided along the projected dicing line 4-1 in the dividing step 1003 of the method illustrated in FIG. 2. In FIGS. 13, 14, and 15, the metal film 7 is omitted from illustration.

The dividing step 1003 is a step, after the laser processing step 1001 and the tape mounting step 1002, of gripping the devices 5 in the area adjacent to the projected dicing line 4-1 vertically between the gripping members 54 and 62 and dividing the sic wafer 1 along the projected dicing line 4-1 by causing the pressing member 70 to press downwardly the devices 5 in the area adjacent to and across the projected dicing line 4-1 from the gripping members 54 and 62 along the X-axis.

According to the first embodiment, in the dividing step 1003, the operator operates the input unit to enter dividing conditions, and the controller 75 receives and registers the dividing conditions. When the controller 75 then receives an instruction to start a dividing process, i.e., the dividing step 1003 according to the first embodiment, the breaking apparatus 30 starts the dividing process.

Specifically, the controller 75 controls the Z-axis moving unit 36 to lower the lower gripping unit 51, controls the cylinder unit 61 of the upper gripping unit 60 to extend the rod 612, and controls the lifting and lowering unit 37 to lift the upper gripping unit 60 and the pressing member 70. Then, according to the first embodiment, the controller 75 controls the second X-axis moving unit 71 to adjust the position of the pressing member 70 along the X-axis such that the distance along the X-axis between the lower end of the upper gripping member 62 and the lower end of the pressing member 70 is in the range from 75% to 85% of the width of the device chips 10 included in the dividing conditions. According to the present invention, the controller 75 may control the second X-axis moving unit 71 to adjust the position of the pressing member 70 along the X-axis such that the distance along the X-axis between the lower end of the upper gripping member 62 and the lower end of the pressing member 70 is in the range from 65% to 95% of the width of the device chips 10.

The controller 75 then controls the X-axis moving unit 32 to retract the frame fixing unit 40 from between the gripping units 51 and 60. The annular frame 9 with the SiC wafer 1 positioned therein on the tape 12 is placed on the holding surface 43 of the frame fixing unit 40 with the outer edge of the tape 12 interposed therebetween. Then, the controller 75 controls the X-axis moving unit 32 to put the frame fixing unit 40 back between the gripping units 51 and 60. Thereafter, the controller 75 controls the suction source fluidly connected to the suction holes in the frame fixing member 42 to secure the annular frame 9 under suction on the holding surface 43 of the frame fixing unit 40 with the outer edge of the tape 12 interposed therebetween, as illustrated in FIG. 13.

The controller 75 then controls the X-axis moving unit 32 and the Y-axis moving unit 34 to position the detecting unit 45 (see FIG. 8) above the projected dicing line 4-1 along which the SiC wafer 1 is to be divided on the basis of a cutting sequence included in the divided conditions, and controls the image capturing camera 46 of the detecting unit 45 to capture an image of a portion of the SiC wafer 1 that includes the projected dicing line 4-1 and a region around the projected dicing line 4-1. The controller 75 detects the projected dicing line 4-1 based on the image captured by the image capturing camera 46.

Then, the controller 75 controls the rotary actuator operatively coupled to the rotor 53 to rotate the rotor 53 to direct upwardly one of the rectangular gripping members 54 that has a length corresponding to the length of the projected dicing line 4-1. The controller 75 also controls the rotary actuator operatively coupled to the frame fixing unit 40 to orient the projected dicing line 4-1 parallel to the Y-axis. The controller 75 controls the X-axis moving unit 32 to position the lower end of the upper gripping member 62 above the devices 5, also denoted by 5-1 in FIG. 13, that are positioned in the area adjacent to and behind the projected dicing line 4-1 along the X-axis in FIG. 8, to position the upper end of the rectangular gripping member 54 below the devices 5-1 that are positioned in the area adjacent to and behind the projected dicing line 4-1 along the X-axis in FIG. 8, and to position the lower end of the pressing member 70 above the devices 5, also denoted by 5-2 in FIG. 13, that are positioned in the area adjacent to and in front of the projected dicing line 4-1 along the X-axis in FIG. 8.

Then, the controller 75 controls the Z-axis moving unit 36 to lift the rotor 53 and the rectangular gripping member 54, pressing upwardly the devices 5-1 adjacent to the projected dicing line 4-1 through the tape 12. As a result, the SiC wafer 1 is lifted, causing the devices 5-1 to abut against the lower end of the upper gripping member 62 through the tape 8. As illustrated in FIG. 14, the devices 5-1 adjacent to the projected dicing line 4-1 are gripped between the gripping members 54 and 62 through the tapes 12 and 8. At this time, the lower end of the pressing member 70 is positioned above the face side 3 of the SiC wafer 1.

Then, on the basis of the dividing conditions, the controller 75 controls the lifting and lowering unit 37 to lower the movable base 38 and the pressing member 70 of the upper gripping unit 60. Since the upper gripping member 62 and the rectangular gripping member 54 grip therebetween the devices 5-1 adjacent to the projected dicing line 4-1 through the tapes 12 and 8, the upper gripping member 62 is not lowered. Instead, the slide unit 63 allows the upper gripping member 62 to be lifted relatively to the movable base 38, retracting the rod 612 of the cylinder unit 61.

When the movable base 38 and the pressing member 70 of the upper gripping unit 60 are lowered, the pressing member 70 has its lower end abutting against the devices 5-2 adjacent to the projected dicing line 4-1 that are positioned across the projected dicing line 4-1 from the gripping units 51 and 60 along the X-axis. As the pressing member 70 is further lowered, the lower end of the pressing member 70 is positioned below the lower end of the upper gripping member 62, dividing the SiC wafer 1 along the projected dicing line 4-1 between the gripping members 54 and 62 and the pressing member 70, as illustrated in FIG. 15.

After the controller 75 has controlled the lifting and lowering unit 37 to lower the movable base 38 and the pressing member 70 according to the dividing conditions, the controller 75 controls the lifting and lowering unit 37 to lift the movable base 38 and the pressing member 70. The controller 75 also controls the Z-axis moving unit 36 to lower the rotor 53 and the rectangular gripping member 54. The controller 75 determines the results of the dividing process on the basis of the load values measured by the load gage 741 and stores the results as linked with the projected dicing line 4-1 in one-to-one correspondence.

According to the dividing conditions, the breaking apparatus 30 divides the SiC wafer 1 successively along the projected dicing lines 4 from the projected dicing line 4 at one end of the SiC wafer 1. After the breaking apparatus 30 has divided the SiC wafer 1 into the individual device chips 10 along all of the projected dicing lines 4, the dividing process, i.e., the dividing step 1003, comes to an end. The device chips 10 divided from the SiC wafer 1 will then be picked up.

In the method of processing an SiC wafer according to the first embodiment described above, the grooves 11 are formed in the metal film 7 by the laser beam 222 applied thereto in the laser processing step 1001, after which the SiC wafer 1 is divided by the pressing member 70 that presses the SiC wafer 1 in the dividing step 1003. In the method of processing a SiC wafer according to the first embodiment, the substrate 2 that is made of SiC that is more difficult to machine than silicon is not cut with a cutting blade. Rather, the SiC wafer 1 is divided by the pressing member 70 of the breaking apparatus 30. The breaking apparatus 30 is able to divide the SiC wafer 1 into the device chips 10 within a shorter period of time than a cutting blade.

As a result, the method of processing a SiC wafer according to the first embodiment is able to reduce the period of time required to process the SiC wafer 1 while preventing the quality with which to process the SiC wafer 1 from being lowered.

In the method of processing a SiC wafer according to the first embodiment, as illustrated in FIG. 5, the laser beam 222 applied to the metal film 7 in the laser processing step 1001 has the elliptical focused spot 223 on the face side of the metal film 7. The elliptical focused spot 223 has a major axis, i.e., a longer axis, extending in the direction along which the projected dicing line 4 extends, i.e., in the longitudinal direction thereof. Consequently, the laser beam 222 can process the SiC wafer 1 at an increased speed to form the grooves 11 that are of a reduced width in the laser processing step 1001.

Second Embodiment

Figure 16:
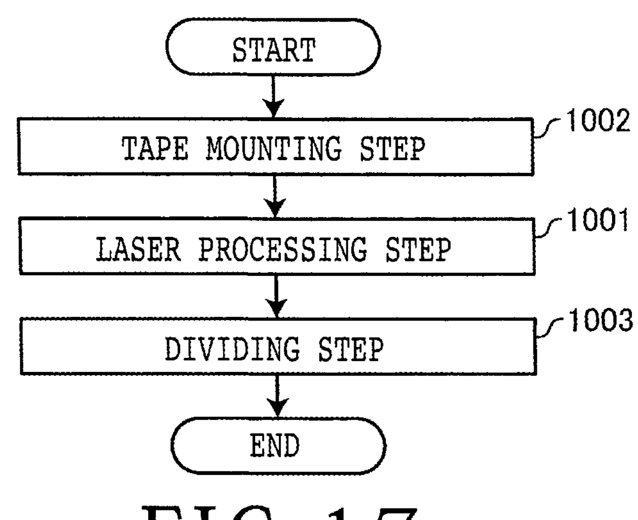
FIG. 16 is a flowchart illustrating the sequence of a method of processing a SiC wafer according to a second embodiment of the present invention.
Figure 17:
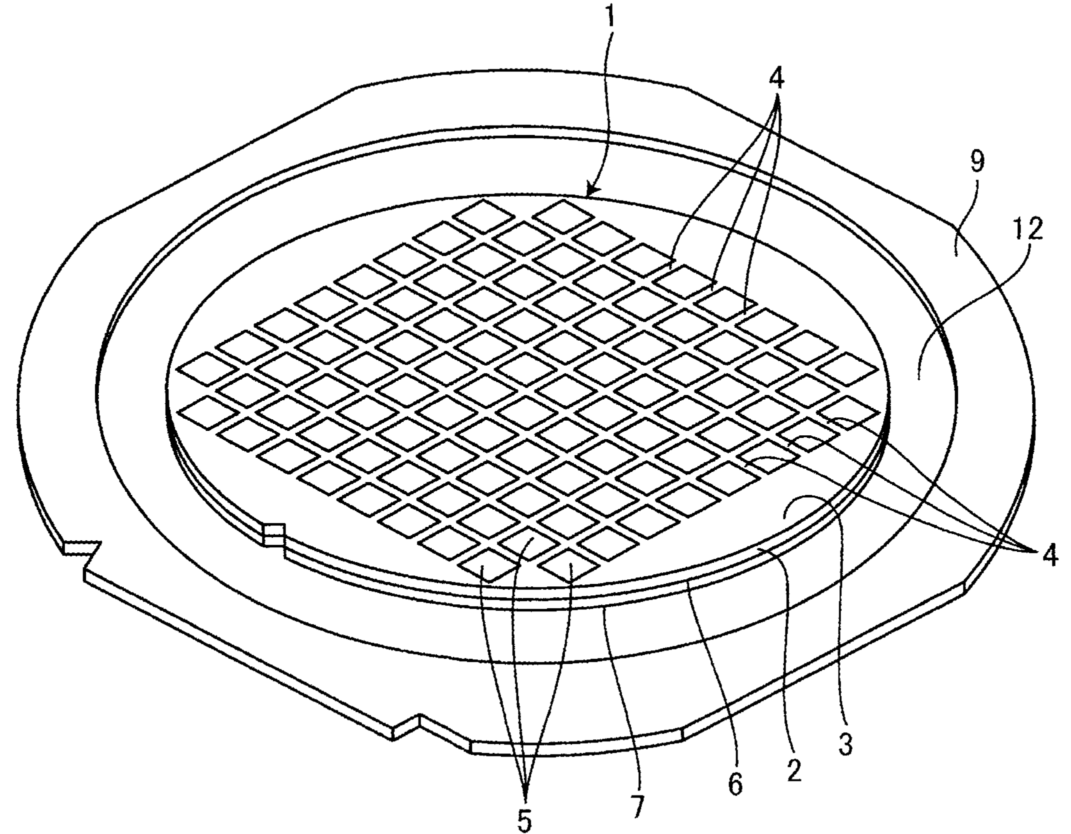
FIG. 17 is a perspective view schematically illustrating a SiC wafer after a tape mounting step of the method illustrated in FIG. 16.
Figure 19:
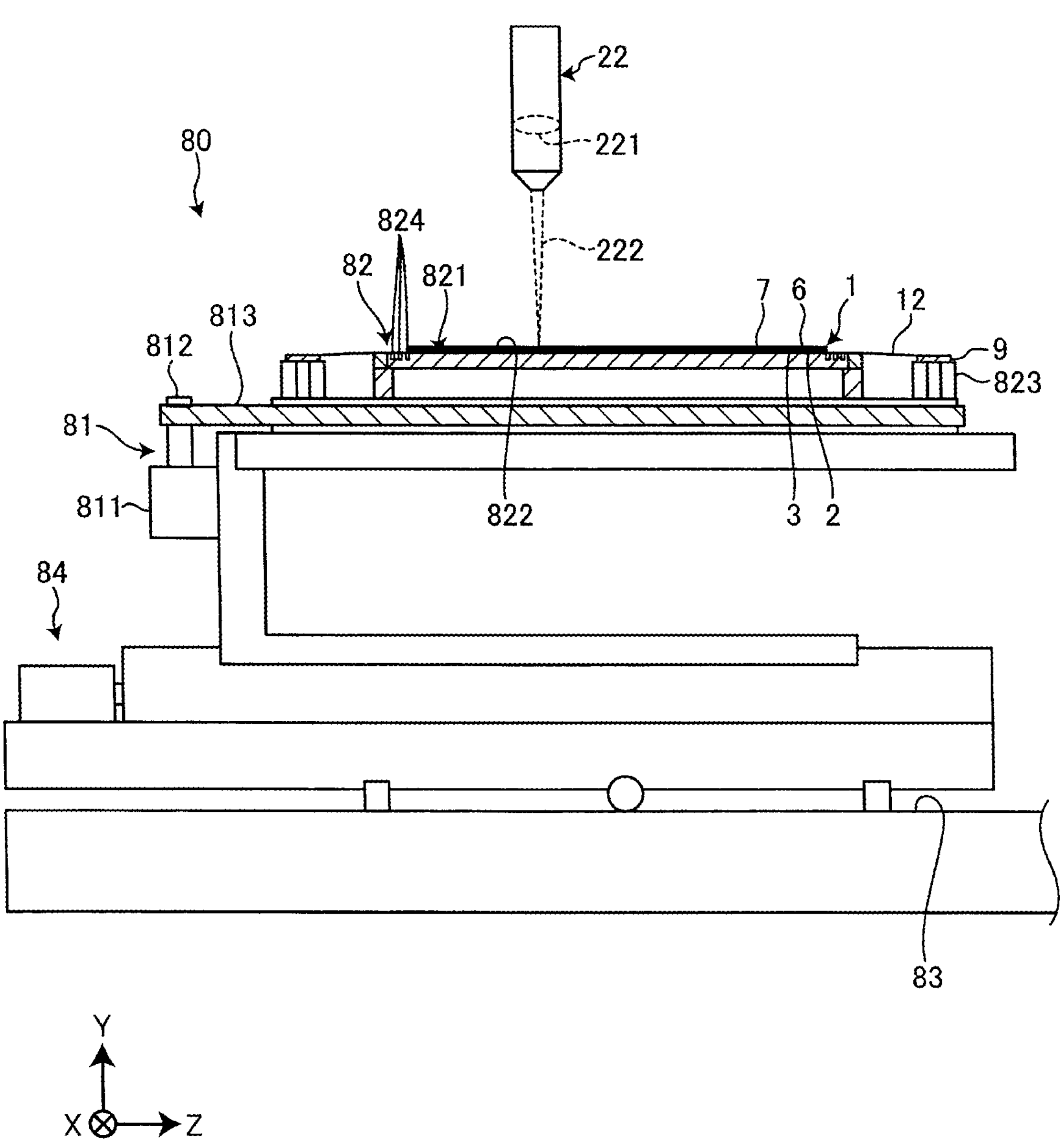
FIG. 19 is a side elevational view, partly in cross section, schematically illustrating the manner in which a laser beam applying unit of the laser processing apparatus applies a laser beam to a metal film of the SiC wafer in the laser processing step of the method illustrated in FIG. 16.
Figure 20:
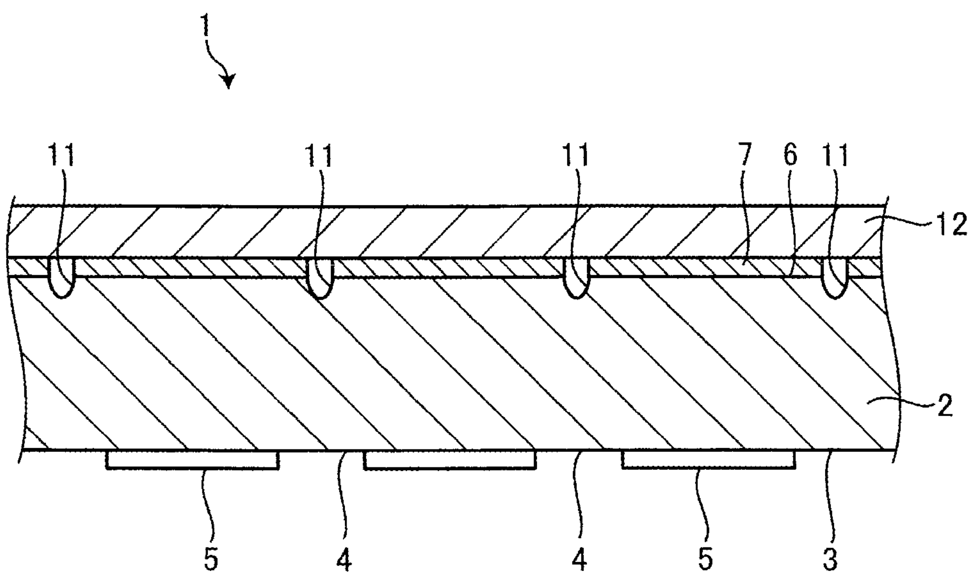
FIG. 20 is a fragmentary cross-sectional view schematically illustrating the SiC wafer after the laser processing step of the method illustrated in FIG. 16.

A method of processing a SiC wafer 1 according to a second embodiment of the present invention will be described below with reference to the drawings. FIG. 16 is a flowchart illustrating the sequence of the method of processing the SiC wafer 1 according to the second embodiment. FIG. 17 schematically illustrates, in perspective, the SiC wafer 1 after a tape mounting step 1002 of the method illustrated in FIG. 16. FIG. 18 schematically illustrates, in side elevation, partly in cross section, the manner in which a lower image capturing camera 85 of a laser processing apparatus 80 captures an image of the SiC wafer 1 held on a holding table 82 in a laser processing step 1001 of the method illustrated in FIG. 16. FIG. 19 schematically illustrates, in side elevation, partly in cross section, the manner in which a laser beam applying unit of the laser processing apparatus 80 applies a laser beam to a metal film 7 of the SiC wafer 1 in the laser processing step 1001 of the method illustrated in FIG. 16. FIG. 20 schematically illustrates, in fragmentary cross section, the SiC wafer 1 after the laser processing step 1001 of the method illustrated in FIG. 16. Those parts illustrated in FIGS. 16, 17, 18, 19, and 20 that are identical to those according to the first embodiment are denoted by identical reference characters and will be omitted from detailed description. In FIG. 18, the metal film 7 is omitted from illustration.

As illustrated in FIG. 16, the method of processing the SiC wafer 1 according to the second embodiment includes the tape mounting step 1002, the laser processing step 1001, and the dividing step 1003. According to the second embodiment, the tape mounting step 1002 is a step of mounting a tape 12 on a metal film 7 before the laser processing step 1001. Stated otherwise, the tape mounting step 1002 is carried out before the laser processing step 1001 according to the second embodiment.

According to the second embodiment, in the tape mounting step 1002, the tape 12 is affixed in its central portion to the metal film 7 on the reverse side 6 of the SiC wafer 1, and an annular frame 9 is affixed to an outer edge of the tape 12, as illustrated in FIG. 17.

According to the second embodiment, the laser processing step 1001 is carried out by a laser processing apparatus 80 having a rotating unit 81 that includes an electric motor 811, a pulley 812 coupled to the rotational output shaft of the electric motor 811, and an endless belt 813 trained around the pulley 812 and a circular rotatable holding table 82. Therefore, the holding table 82 is rotatable about its central axis parallel to a Z-axis, which is indicated by the arrow Z and extends vertically, by the rotating unit 81. In the laser processing step 1001, a face side 3 of the SiC wafer 1 to be processed is placed on a holding plate 821 on the holding table 82, and the annular frame 9 is placed on a frame fixing unit 823 disposed around the holding plate 821. The holding plate 821 is made of a transparent material such as quartz glass, borosilicate glass, sapphire, calcium fluoride, lithium fluoride, or magnesium fluoride, for example. The holding plate 821 has an upper surface functioning as a holding surface 822 for holding the SiC wafer 1 thereon.

Then, a suction groove 824 defined in an outer edge portion of the holding plate 821 is evacuated by a suction source, not depicted, holding the face side 3 of the SiC wafer 1 under suction on the holding surface 822. A vacuum pad, not depicted, of the frame fixing unit 823 is also evacuated by the suction source, holding the annular frame 9 under suction on the holding surface 822. The laser processing apparatus 80 includes an X-axis moving unit 83 for moving the holding table 82 along an X-axis indicated by the arrow X and extending horizontally, a Y-axis moving unit 84 for moving the holding table 82 along a Y-axis indicated by the arrow Y and extending horizontally perpendicularly to the X-axis, and a second Y-axis moving unit 86 for moving a lower image capturing camera 85 along the Y-axis. The laser processing apparatus 80 also includes a controller, not depicted, for controlling the components thereof. The controller controls the X-axis moving unit 83, the Y-axis moving unit 84, and the second Y-axis moving unit 86 to position the lower image capturing camera 85 below the SiC wafer 1 held on the holding plate 821.

The lower image capturing camera 85 thus positioned captures an image of the SiC wafer 1 from below the holding plate 821 and the holding table 82. Then, the controller performs an alignment process for positioning one of the projected dicing lines 4 on the SiC wafer 1 with respect to a condensing lens 221 (see FIG. 19) of a laser beam applying unit 22 on the basis of the image captured by the lower image capturing camera 85. Then, while the X-axis moving unit 83, the Y-axis moving unit 84, and the second Y-axis moving unit 86 are moving the holding table 82 and the laser beam applying unit 22 relatively to each other along the projected dicing line 4, the controller controls the laser beam applying unit 22 to apply a laser beam 222, which has a wavelength of 355 nm, for example, absorbable by a metal film 7 on a substrate 2 of the SiC wafer 1, emitted from a laser oscillator, not depicted, through a tape 12 on the SiC wafer 1 to the metal film 7 along each of the projected dicing lines 4, thereby severing the metal film 7 by way of ablation.

According to the second embodiment, as with the first embodiment, the laser beam 222 applied to the metal film 7 in the laser processing step 1001 has an elliptical focused spot on the face side of the metal film 7. The elliptical focused spot on the face side of the metal film 7 has a major axis, i.e., a longer axis, extending in the direction along which the projected dicing line 4 extends, i.e., in the longitudinal direction thereof. As illustrated in FIG. 20, the laser processing apparatus 80 forms a plurality of grooves 11 in the metal film 7 and the substrate 2 along the respective projected dicing lines 4 over their entire length, by thus applying the laser beam 222. The grooves 11 sever the metal film 7 and remove part of the substrate 2, exposing the substrate 2 at their bottoms.

According to the second embodiment, the laser beam 222 is transmittable through the tape 12. Therefore, the grooves 11 are formed in the SiC wafer 1, but not in the tape 12.

In the method of processing a SiC wafer 1 according to the second embodiment, in the tape mounting step 1002, the tape 8 is affixed in its central portion to the face side 3 of the SiC wafer 1, and the annular frame 9 is affixed to the outer edge of the tape 8. After the laser processing step 1001, the dividing step 1003 is carried out by the breaking apparatus 30 illustrated in FIGS. 13 through 15, as with the first embodiment.

In the method of processing the SiC wafer 1 according to the second embodiment, after the laser beam 222 has been applied to form the grooves 11 in the metal film 7 and the substrate 2 in the laser processing step 1001, the pressing member 70 (see FIG. 10) presses the SiC wafer 1 to sever the SiC wafer 1 in the dividing step 1003. Therefore, the substrate 2 made of SiC is not cut by a cutting blade, but is divided by the pressing member 70. The period of time required to process the SiC wafer 1 is shorter than if the SiC wafer 1 is cut by a cutting blade. The method of processing a SiC wafer according to the second embodiment is thus advantageous in that the period of time required to process the SiC wafer 1 is reduced while preventing the quality with which to process the SiC wafer 1 from being lowered.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a SiC wafer having a plurality of projected dicing lines established on a face side thereof and a metal film layered on a reverse side thereof, the method comprising:

a laser processing step of applying a laser beam to the SiC wafer along the projected dicing lines to sever the metal film along the projected dicing lines and form grooves in the SiC wafer along the projected dicing lines;

a tape mounting step of mounting a tape on the metal film before or after the laser processing step; and after the laser processing step and the tape mounting step, a dividing step of gripping, vertically between gripping members, an area of the SiC wafer adjacent to one at a time of the projected dicing lines along which the SiC wafer is to be divided and pressing, with a pressing member, an area of the SiC wafer adjacent to and across the one of the projected dicing lines from the gripping members, thereby dividing the SiC wafer along the one of the projected dicing lines.

2. The method of processing a SiC wafer according to claim 1, wherein the tape mounting step is carried out before the laser processing step, and the laser processing step includes a step of holding the face side of the SiC wafer on a holding table and applying the laser beam through the tape to the metal film to sever the metal film along the projected dicing lines and form laser-processed grooves in the SiC wafer along the projected dicing lines.

3. The method of processing a SiC wafer according to claim 1, wherein the laser beam applied to the SiC wafer in the laser processing step has an elliptical focused spot on the metal film, and the laser processing step includes a step of orienting a major axis of the elliptical focused spot in a direction along which the projected dicing line extends.

* * * * *